(12) United States Patent
Lee

(10) Patent No.: US 12,489,076 B2
(45) Date of Patent: Dec. 2, 2025

(54) POWER MODULE FOR HIGH-FREQUENCY USE AND METHOD FOR MANUFACTURING THE SAME

(71) Applicant: BOARDTEK ELECTRONICS CORPORATION, Taoyuan (TW)

(72) Inventor: Chien-Cheng Lee, New Taipei (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 692 days.

(21) Appl. No.: 17/865,586

(22) Filed: Jul. 15, 2022

(65) Prior Publication Data
US 2023/0411334 A1   Dec. 21, 2023

(30) Foreign Application Priority Data
Jun. 16, 2022   (CN) .......................... 202210689225.7

(51) Int. Cl.
| | |
|---|---|
| H01L 23/00 | (2006.01) |
| H01L 21/48 | (2006.01) |
| H01L 23/367 | (2006.01) |
| H01L 23/498 | (2006.01) |

(52) U.S. Cl.
CPC ............ *H01L 24/20* (2013.01); *H01L 21/486* (2013.01); *H01L 21/4867* (2013.01); *H01L 23/367* (2013.01); *H01L 23/49827* (2013.01); *H01L 24/19* (2013.01); *H01L 24/32* (2013.01); *H01L 24/29* (2013.01); *H01L 24/83* (2013.01); *H01L 2224/19* (2013.01); *H01L 2224/211* (2013.01); *H01L 2224/29339* (2013.01); *H01L 2224/83192* (2013.01); *H01L 2224/83201* (2013.01)

(58) Field of Classification Search
None
See application file for complete search history.

(56) References Cited

U.S. PATENT DOCUMENTS

2019/0131208 A1*   5/2019   Feichtinger ....... H01L 23/49833

FOREIGN PATENT DOCUMENTS

| CN | 108346628 A | * | 7/2018 | ........... H01L 23/367 |
|---|---|---|---|---|
| TW | I599285 B | | 9/2017 | |

\* cited by examiner

*Primary Examiner* — Kretelia Graham
*Assistant Examiner* — Nkechinyere Esiaba
(74) *Attorney, Agent, or Firm* — ScienBiziP, P.C.

(57) ABSTRACT

A high-frequency power module less vulnerable to parasitic phenomena includes first base board, power chip, and second base board. The first base board includes a first substrate, a first conductive wiring layer, and a second conductive wiring layer on each side of the first substrate. The power chip is disposed on the first conductive wiring layer. The second base board includes a second substrate covering the power chip and the first conductive wiring layer, and a third conductive wiring layer away from the first conductive wiring layer. First conductive structures penetrate the second substrate to connect the third conductive wiring layer with the power chip, greatly reducing the lengths of signal paths between components and so parasitic effects A second conductive structure penetrates the first and second substrates to connect the first, second, and third conductive wiring layers. A manufacturing method is also disclosed.

8 Claims, 11 Drawing Sheets

POWER MODULE FOR HIGH-FREQUENCY USE AND METHOD FOR MANUFACTURING THE SAME

FIELD

The present disclosure relates to a power module, in particular to a power module with a shorter signal path of a power chip and a method for manufacturing the power module.

BACKGROUND

A power module with a power chip may be utilized for a variety of electronic devices including power converters, chargers for electric vehicles, uninterruptible power supplies (UPS), etc. Bonding wires are extensively used for the interconnection between the power chip and lead frames or golden fingers on the printed circuit board (PCB) since they are inexpensive and robust. However, as operating frequencies move to and beyond several giga-hertz, the parasitic inductance and the parasitic capacitance induced by the bonding wires can significantly impact the circuit performance and may no longer be negligible. Therefore, the parasitic effects need to be reduced if not eliminated.

BRIEF DESCRIPTION OF THE DRAWINGS

The following drawings are to be viewed in conjunction with the embodiments described herein.

DETAILED DESCRIPTION

Figure 1:
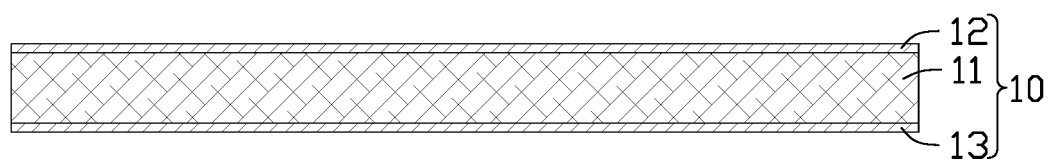
FIG. 1 is a cross-sectional view of a first base board according to an embodiment of the present disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set fourth herein. Rather, these exemplary embodiments are provided so that this disclosure will be thorough and complete, and will fully convey the scope of the disclosure to those skilled in the art. Like reference numerals refer to like elements throughout.

As used herein, when a first component is referred to as "connecting" to a second component, it is intended that the first component may be directly connected to the second component or may be indirectly connected to the second component via a third component between them. When a first component is referred to as "disposed to" a second component, it is intended that the first component may be directly disposed to the second component or may be disposed to the second component via a third component between them. The terms "perpendicular," "horizontal," "left," "right," and similar expressions used herein are merely intended as indicators and not as absolute categories.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. The term "and/or" used herein includes any suitable combination of one or more related items listed.

A method for manufacturing a power module is provided by way of example, as there are a variety of ways to carry out the method. The method can begin at step S1.

At step S1, referring to FIG. 1, a first base board 10 is provided. The base board 10 includes a first substrate 11, a first metal layer 12, and a second metal layer 13. The first metal layer 12 and the second metal layer 13 are disposed on opposite sides of the first substrate 11.

The first substrate 11 is made of an insulating material having a low coefficient of thermal expansion. In some embodiments, the first substrate 11 is made of the FR-4 material, and the first metal layer 12 and the second metal layer 13 are made of copper.

Figure 5:
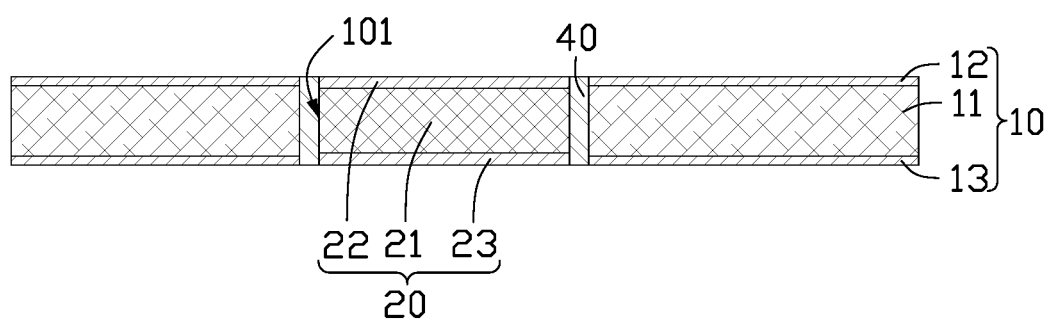
FIG. 5 is a cross-sectional view of FIG. 4, but without the adhesive tape.

At step S2, referring to FIG. 5, a third base board 20 is embedded into the first base board 10. The third base board 20 is electrically insulated from the first base board 10.

The third base board 20 includes a third substrate 21, a first conductor layer 22, and a second conductor layer 23. The first conductor layer 22 and the second conductor layer 23 are disposed on opposite sides of the third substrate 21. The first conductor layer 22 is flush with and electrically insulated from the first metal layer 12. The second conductor layer 23 is flush with and electrically insulated from the second metal layer 13.

The third substrate 21 is made of an insulating and heat dissipating material. In some embodiments, the third substrate 21 is made of ceramic, and the first conductor layer 22 and the second conductor layer 23 are made of metal. In some embodiments, the first conductor layer 22 and the second conductor layer 23 are copper foils.

Figure 2:
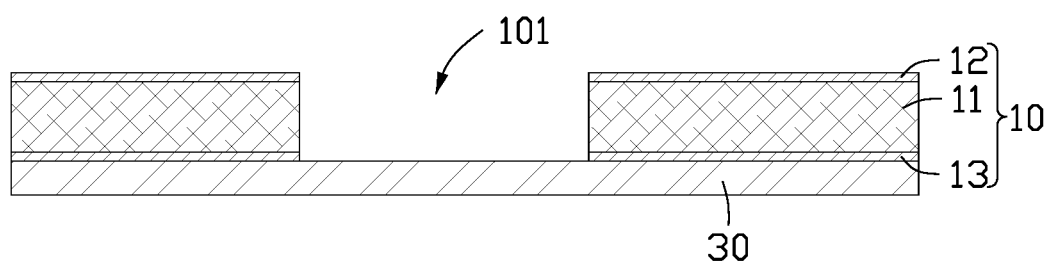
FIG. 2 is a cross-sectional view showing an opening with an adhesive tape formed on the first base board of FIG. 1.

In some embodiments, the step S2 specifically includes the following steps:

Step S21, referring to FIG. 2, an opening 101 is formed on the first base board 10, the opening 101 penetrating the first substrate 11, the first metal layer 12, and the second metal layer 13. The opening 101 may be formed by a laser drilling manner, a mechanical drilling manner, etc.

Step S22, referring to FIG. 2, an adhesive tape 30 is attached to a surface of the first base board 10, the adhesive tape 30 covering an end of the opening 101. Specifically, the adhesive tape 30 covers a surface of the second metal layer 13 facing away from the first substrate 11 and an end of the opening 101 close to the second metal layer 13.

Figure 3:
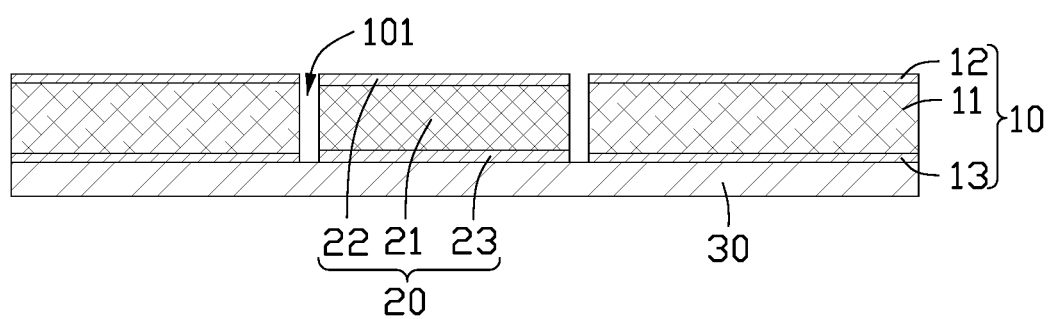
FIG. 3 is a cross-sectional view showing a third base board installed in the opening of FIG. 2.

Step S23, referring to FIG. 3, the third base board 20 is placed into the opening 101. The third base board 20 is supported by the adhesive tape 30. Specifically, the second conductor layer 23 is bonded to the adhesive tape 30. The third base board 20 and a side wall of the opening 101 define a gap therebetween.

Figure 4:
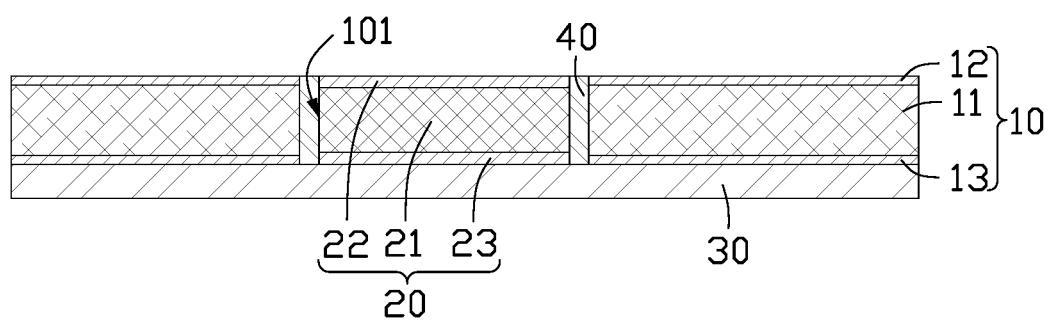
FIG. 4 is a cross-sectional view showing insulating material infilling the opening of FIG. 3.

Step S24, referring to FIG. 4, the opening 101 is infilled with an insulating material 40. The insulating material 40 infills the gap between the third base board and the opening 101, electrically insulating the first conductor layer 22 and the second conductor layer 23 from the first metal layer 12 and the second metal layer 13 respectively. An end of the insulating material 40 is flush with the first metal layer 12 and the first conductor layer 22, and other end of the insulating material is flush with the second metal layer 13 and the second conductor layer 23. The insulating material 40 may be a resin material.

Step S25, referring to FIG. 5, the adhesive tape is removed to expose the second metal layer 13 and the second conductor layer 23. The third base board 20 is embedded in the first base board 10.

Figure 6:
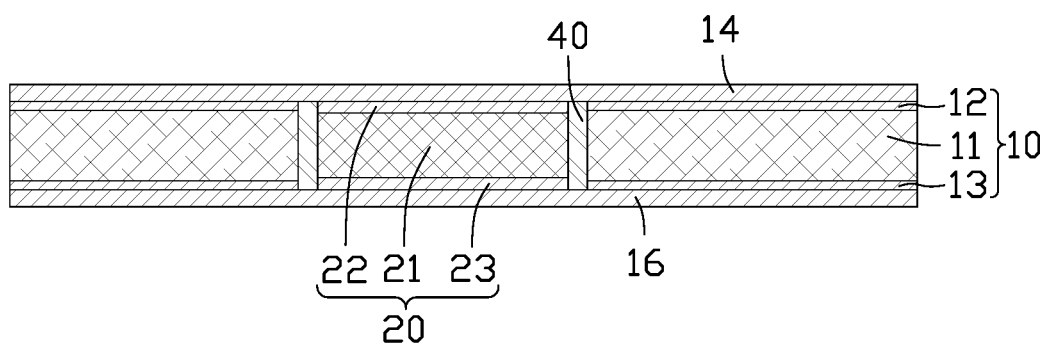
FIG. 6 is a cross-sectional view showing a third metal layer and a fourth metal layer formed on the sides of the first base board of FIG. 5.

At step S3, referring to FIG. 6, a third metal layer 14 and a fourth metal layer 16 are formed on opposite sides of the first base board 10. The third metal layer 14 covers the first metal layer 12, the first conductor layer 22, and an end of the insulating material 40 adjacent to the first metal layer. The fourth metal layer 16 covers the second metal layer 13, the second conductor layer 23, and an end of the insulating material 40 adjacent to the second metal layer 13.

In some embodiments, the third metal layer 14 and the fourth metal layer 16 are formed by electroplating. The third metal layer 14 and the fourth metal layer 16 are made of copper.

Figure 7:
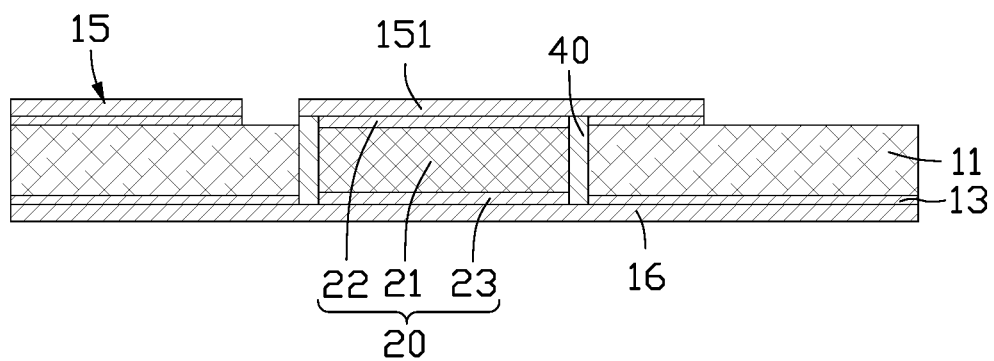
FIG. 7 is a cross-sectional view showing a first conductive wiring layer formed from the third metal layer of FIG. 6.

At step S4, referring to FIG. 7, a first conductive wiring layer 15 is formed from the first metal layer and the third metal layer.

The first conductive wiring layer 15 includes a first conductive pattern 151 formed from the third metal layer. The first conductive pattern 151 covers the first conductor layer 22. In some embodiments, the first conductive pattern 151 covers without interruption a surface of the first conductor layer 22 facing away from the third substrate 21 and an end face of the insulating material 40 close to the first conductive wiring layer 15.

Figure 8:
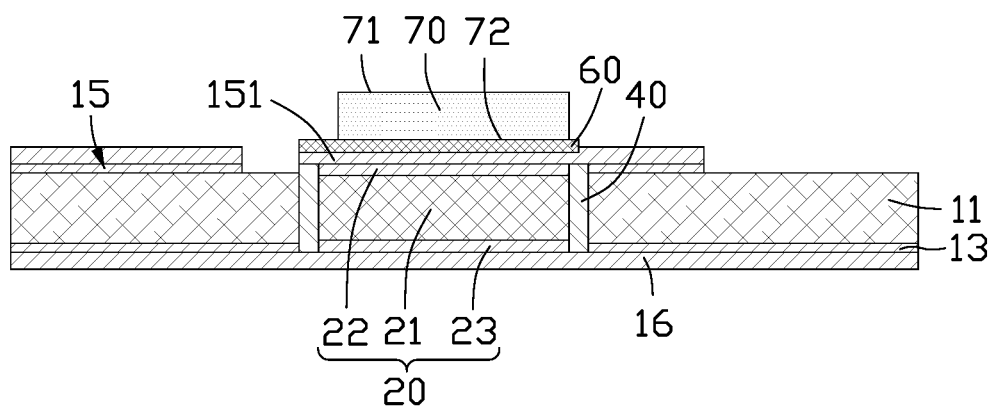
FIG. 8 is a cross-sectional view showing a power chip mounted on the first conductive wiring layer of FIG. 7.

At step S5, referring to FIG. 8, a power chip 70 is mounted on the first conductive pattern 151. The power chip 70 is electrically connected with the first conductive pattern 151.

The power chip 70 may be an insulated gate bipolar transistor (IGBT), a metal oxide semiconductor field effect transistor (MOSFET), a thyristor, a gate turn off thyristor (GTO), a power transistor (GTR), a bipolar junction transistor (BJT), or a single junction transistor (UJT).

The power chip 70 includes a first surface 71 and a second surface 72 opposite to the first surface 71. The power chip 70 further includes a source terminal and a gate terminal on the first surface 71 and a drain terminal on the second surface 72.

The power chip 70 may be fixed on the first conductive pattern 151 by soldering, sintering, or using a conductive paste. In some embodiment, the power chip 70 is fixed on the first conductive pattern 151 via a first conductive paste 60. The first conductive paste 60 is sandwiched between the second surface 72 of the power chip 70 and the first conductive pattern 151. Specifically, the first conductive paste 60 is formed on the first conductive pattern 151 by printing then the power chip is pressed onto the first conductive pattern 151, thereby fixing the power chip 70 to the first conductive pattern 151. In some embodiments, the first conductive paste 60 is a silver or silver-based paste.

Figure 9:
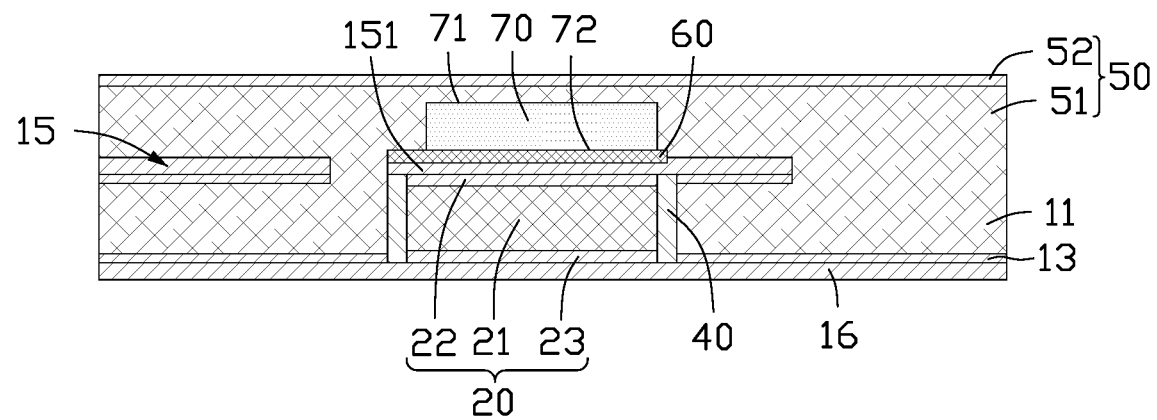
FIG. 9 is a cross-sectional view showing a second base board pressed onto the first conductive wiring layer of FIG. 8.

At step S6, referring to FIG. 9, a second base board 50 is pressed onto the first conductive wiring layer 15 and the power sensor 70. The power sensor 70 is embedded into the second base board 50.

The second base board 50 includes a second substrate 51 and a fifth metal layer 52 laminated on the second substrate 51. The second substrate 51 covers the first conductive wiring layer 15 and the power chip 70, infills line gaps in the first conductive wiring layer 15, and is connected with the first substrate 11. The fifth metal layer 52 is on a side of the second substrate 51 facing away from the first conductive wiring layer 15. The second substrate 51 is made of a conventional insulating material for a circuit board, such as the FR-4 material. The fifth metal layer 52 is made of copper. In other embodiments, the first to fifth metal layers may be made of other metal materials.

Figure 10:
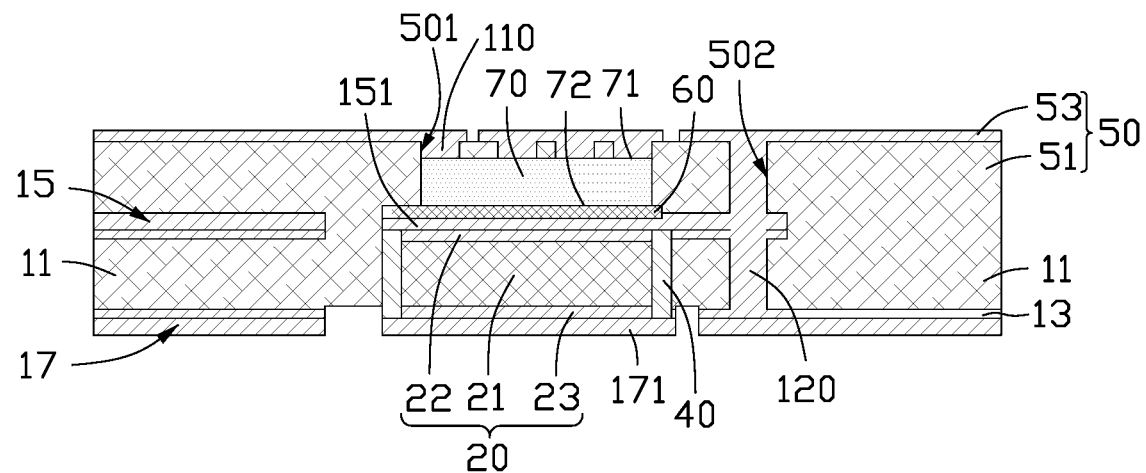
FIG. 10 is a cross-sectional view showing a first conductive structure, a second conductive structure, a second conductive wiring layer, and a third conductive wiring layer formed on the structure shown in FIG. 9.

At step S8, referring to FIG. 10, a plurality of first conductive structures 110 and a second conductive structure 120 are formed.

The first conductive structures 110 penetrate the second substrate 51 and are in contact with and electrically connected with the source terminal and the gate terminal on the first surface 71 of the power chip 70 respectively. The second conductive structure 120 penetrates the second substrate 51 and the first substrate 11 and is in contact with and electrically connected with the first conductive pattern 151, the fifth metal layer, and the second metal layer. The drain terminal of the power chip 70 is electrically connected with the second conductive structure 120 via the first conductive pattern 151.

In some embodiments, the first conductive structures 110 are formed by a method including forming a plurality of first through holes 501 penetrating the second substrate and electroplating the first through holes 501 to form the first conductive structures 110. In some embodiments, the first conductive structures 110 are formed by a method including forming the first through holes 501 and infilling the first through holes 501 with a conductive paste to form the first conductive structures 110.

In some embodiments, the second conductive structure 120 is formed by a method including electroplating a second through hole 502 penetrating the first and second substrates, or infilling the second through hole 502 with a conductive paste.

At step S7, referring to FIG. 10, a second conductive wiring layer 17 is formed from the second metal layer and the fourth metal layer, and a third conductive wiring layer 53 is formed from the fifth metal layer.

The second conductive wiring layer 17 includes a second conductive pattern 171 which is formed from the fourth metal layer. The second conductive pattern 171 covers the second conductor layer 23. In some embodiments, the second conductive pattern 171 covers without interruption a surface of the second conductor layer 23 facing away from the third substrate 21 and an end face of the insulating material 40 close to the second conductive wiring layer 17.

Figure 11:
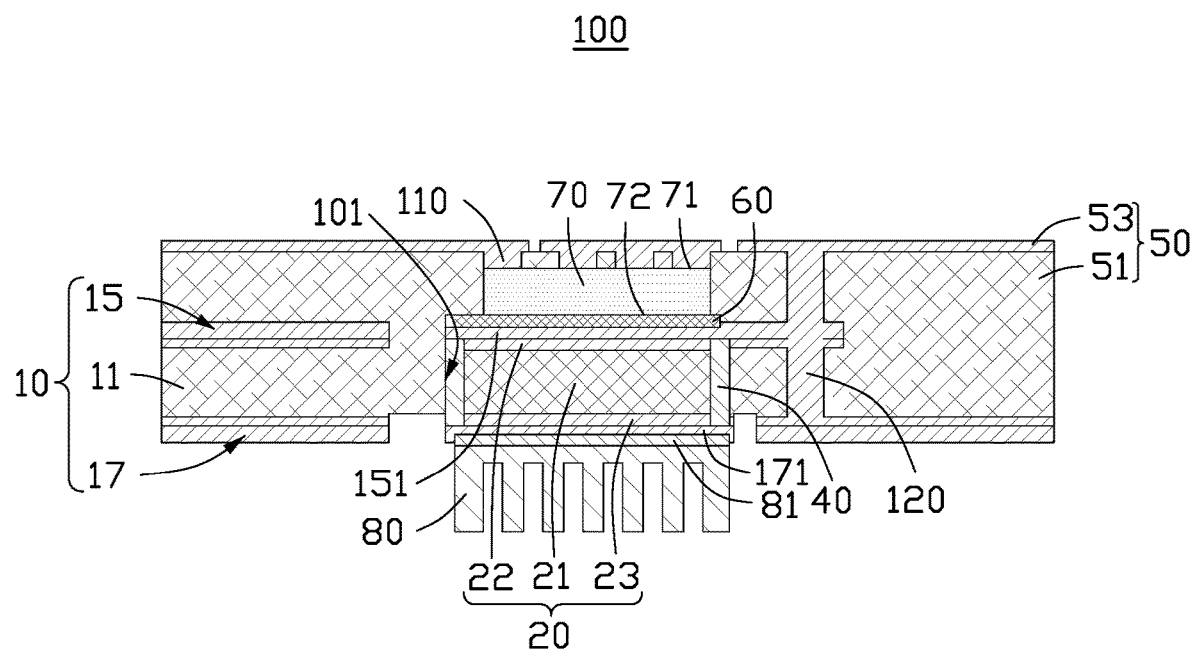
FIG. 11 is a cross-sectional view showing a power module according to an embodiment of the present disclosure.

At step S8, referring to FIG. 11, a heat sink 80 is mounted on the second conductive pattern 171, thereby obtaining a power module 100.

The heat sink 80 may be connected with the second conductive pattern 171 by welding, sintering, or using a conductive paste. In some embodiments, the heat sink 80 is fixed on the second conductive pattern 171 through a second conductive paste 81. The second conductive paste 81 is sandwiched between the heat sink 80 and the second conductive pattern 171. Specifically, the second conductive paste 81 is formed on the second conductive pattern 171 by printing, then the heat sink 80 is pressed onto the second conductive paste 81, thereby fixing the heat sink 80 to the second conductive pattern 171. In some embodiments, the second conductive paste 81 is a silver paste.

Heat generated by the power chip 70 is rapidly transferred to an external environment through the first conductive paste 60, the first conductive pattern 151, the third substrate 21, the second conductive pattern 171, and the heat sink 80 which have a high heat conductivity coefficient, thereby improving the heat dissipation efficiency.

Referring to FIG. 11, the power module 100 in one embodiment includes the first base board 10, the second base board 50, the third base board 20, the power chip the first conductive structures 110, and the second conductive structure 120.

The first base board 10 includes the first substrate 11, the first conductive wiring layer 15, and the second conductive wiring layer 17. The first conductive wiring layer 15 and the second conductive wiring layer 17 are laminated on opposite sides of the first substrate 11. The first base board 10 defines the opening 101 penetrating the first substrate 11.

The third base board 20 includes the third substrate 21, the first conductor layer 22, and the second conductor layer 23. The first conductor layer 22 and the second conductor layer 23 are laminated on opposite sides of the third substrate 21. The third substrate 21 is accommodated in the opening 101. The first conductor layer 22 and the second conductor layer 23 protrude out of the opening 101. The insulating material 40 infills the gap between the side wall of the opening 101 and the third substrate 21.

The first conductive wiring layer 15 includes the first conductive pattern 151. The first conductive pattern 151 covers the first conductor layer 22. An end of the insulating material 40 extends into the first conductive wiring layer 15 and makes contact with the first conductive pattern 151.

The second conductive wiring layer 17 includes a second conductive pattern 171. The second conductive pattern 171 covers the second conductor layer 23. The insulating material 40 extends into the second conductive wiring layer 17 and makes contact with the second conductive pattern 171.

The power chip 70 is fixed on the first conductive pattern 151 through the first conductive paste 60.

The second base board 50 includes a second substrate 51 and a fifth metal layer 52 laminated on the second substrate 51. The second substrate 51 covers the first conductive wiring layer 15 and the power chip 70, infills line gaps in the first conductive wiring layer 15, and is connected with the first substrate 11. The third conductive wiring layer 53 is on a side of the second substrate 51 facing away from the first conductive wiring layer 15.

The first conductive structures 110 penetrate the second substrate 51 and electrically connect the third conductive wiring layer 53 with the source terminal and the gate terminal on the first surface 71 of the power chip 70. The second conductive structure 120 penetrates the first substrate 11 and the second substrate 51 and electrically connects the first conductive pattern 151, the second conductive wiring layer 17, and the third conductive wiring layer 53. The first conductive structures 110 and the second conductive structure 120 may be conductive holes or conductive pillars.

The arrangement of the first conductive structures 110 and the second conductive structure 120 penetrating the second substrate 51 and electrically connecting the power chip 70 with the third conductive wiring layer 53 significantly shortens a signal path of the power chip 70, and so reduces parasitic phenomena.

The above is only a preferred embodiment of the present disclosure, and is not intended to limit the scope of the present disclosure. Although embodiments of the present disclosure are described above, it is not intended to limit the present disclosure. The present disclosure may be modified or modified to equivalent variations without departing from the technical scope of the present disclosure by any person skilled in the art. Any simple modifications, equivalent changes and modifications made to the above embodiments remain within the scope of the technical solutions of the present disclosure.

What is claimed is:

1. A power module comprising:
   a first base board comprising a first substrate, a first conductive wiring layer, and a second conductive wiring layer, the first conductive wiring layer and the second conductive wiring layer being disposed on opposite sides of the first substrate;
   a power chip disposed on the first conductive wiring layer and comprising a first surface facing away from the first base board and a second surface facing the first base board, the second surface being electrically connected with the first conductive wiring layer;
   a second base board comprising a second substrate and a third conductive wiring layer, the second substrate covering the first conductive wiring layer and the power chip and being connected with the first substrate, the third conductive wiring layer being on a side of the second substrate facing away from the first conductive wiring layer;
   a plurality of first conductive structure penetrating the second substrate and electrically connecting the third conductive wiring layer with the first surface of the power chip;
   a second conductive structure penetrating the first substrate and the second substrate and electrically connecting the first conductive wiring layer, the second conductive wiring layer, and the third conductive wiring layer; and
   a third base board embedded into the first base board, wherein the third base board corresponds to a position of the power chip, the third base board comprises a third substrate, a first conductor layer, and a second conductor layer, the first conductor layer and the second conductor layer are disposed on opposite sides of the third substrate, the first conductor layer is in contact with the first conductive wiring layer, and the second conductor layer is in contact with the second conductive wiring layer.

2. The power module of claim 1, wherein the first substrate defines an opening penetrating the first substrate, the third substrate is accommodated in the opening, the first conductor layer and the second conductor layer protrude out of the opening, the first conductive wiring layer comprises a first conductive pattern covering the first conductor layer, the power chip is disposed on the first conductive pattern, and the second conductive wiring layer comprises a second conductive pattern covering the second conductor layer.

3. The power module of claim 2, further comprising an insulating material infilling a gap between a side wall of the opening and the third substrate, wherein both ends of the insulating material extend into the first conductive wiring layer and the second conductive wiring layer to make contact with the first conductive pattern and the second conductive pattern respectively.

4. The power module of claim 2, further comprises a heat sink disposed on the second conductive pattern.

5. The power module of claim 4, further comprising a first conductive paste for fixing the power chip on the first conductive pattern and a second conductive paste for fixing the heat sink on the second conductive pattern.

6. The power module of claim 5, wherein the first conductive paste is sandwiched between the power chip and the first conductive pattern, and the second conductive paste is sandwiched between the heat sink and the second conductive pattern.

7. The power module of claim 6, wherein the first conductive paste and the second conductive paste are silver pastes.

8. The power module of claim 1, wherein a material of the third substrate is ceramic, and materials of the first conductor layer and the second conductor layer are metal.

* * * * *